(12) United States Patent
Park et al.

(10) Patent No.: US 10,356,960 B2
(45) Date of Patent: Jul. 16, 2019

(54) DEVICE FOR RADIATING HEAT OF CAPACITOR OF AN INVERTER IN AN ELECTRIC COMPRESSOR

(71) Applicant: Hanon Systems, Daejeon (KR)

(72) Inventors: Sung Jun Park, Daejeon (KR); Young Hun Lee, Daejeon (KR); Seung Hwan Shin, Daejeon (KR); Hee Kwon Park, Daejeon (KR); Sae Won Oh, Daejeon (KR); Kyung Hun Jung, Daejeon (KR)

(73) Assignee: HANON SYSTEMS, Daejeon (KR)

( * ) Notice: Subject to any disclaimer, the term of this patent is extended or adjusted under 35 U.S.C. 154(b) by 0 days.

(21) Appl. No.: 16/125,968

(22) Filed: Sep. 10, 2018

(65) Prior Publication Data

US 2019/0008070 A1    Jan. 3, 2019

Related U.S. Application Data

(63) Continuation of application No. 15/027,010, filed as application No. PCT/KR2015/002762 on Mar. 20, 2015, now Pat. No. 10,143,115.

(51) Int. Cl.
| | |
|---|---|
| *H05K 7/20* | (2006.01) |
| *H02K 11/33* | (2016.01) |
| *B60H 1/32* | (2006.01) |
| *F04B 39/06* | (2006.01) |
| *F04B 39/12* | (2006.01) |
| *H01G 2/08* | (2006.01) |
| *H02K 5/22* | (2006.01) |
| *H02K 7/14* | (2006.01) |

(52) U.S. Cl.
CPC .......... *H05K 7/209* (2013.01); *B60H 1/3223* (2013.01); *F04B 39/066* (2013.01); *F04B 39/121* (2013.01); *H01G 2/08* (2013.01); *H02K 11/33* (2016.01); *H05K 7/20* (2013.01); *H02K 5/225* (2013.01); *H02K 7/14* (2013.01)

(58) Field of Classification Search
None
See application file for complete search history.

(56) References Cited

U.S. PATENT DOCUMENTS

| | | | | |
|---|---|---|---|---|
| 5,016,139 | A * | 5/1991 | Stopa | H05K 5/0247 307/150 |
| 7,069,649 | B2 * | 7/2006 | Tsunezaki | H01G 2/04 29/832 |

(Continued)

FOREIGN PATENT DOCUMENTS

| | | |
|---|---|---|
| JP | H07283071 A | 10/1995 |
| JP | 2005102464 A | 4/2005 |

(Continued)

*Primary Examiner* — Courtney L Smith
(74) *Attorney, Agent, or Firm* — Shumaker, Loop & Kendrick, LLP; James D. Miller

(57) ABSTRACT

An apparatus for cooling an inverter of a vehicle which receives power supplied from a vehicle battery and controls the rotation speed of a motor, wherein the apparatus includes an inverter housing configured to support the inverter, and a heat dissipation unit provided at a predetermined position in the inverter housing and configured to come into contact with an outer circumferential surface of the capacitor so that heat of the capacitor is transferred to the inverter housing.

16 Claims, 4 Drawing Sheets

PRIOR ART

(56) References Cited

U.S. PATENT DOCUMENTS

| | | | |
|---|---|---|---|
| 8,816,548 B2* | 8/2014 | Tomizawa | H02K 11/33 310/67 R |
| 9,351,432 B2* | 5/2016 | Tsuboi | H05K 7/20854 |
| 2005/0223727 A1* | 10/2005 | Funahashi | F01C 21/10 62/228.4 |
| 2009/0201648 A1* | 8/2009 | Ganev | H05K 7/209 361/707 |
| 2010/0181850 A1* | 7/2010 | Ichise | F04B 39/0044 310/71 |
| 2010/0181877 A1* | 7/2010 | Watanabe | F04B 35/04 310/68 D |
| 2013/0257192 A1* | 10/2013 | Tsuboi | H02K 9/22 310/52 |
| 2016/0284470 A1* | 9/2016 | Nakamura | H01G 2/06 |
| 2017/0015347 A1* | 1/2017 | Asao | B62D 5/0406 |
| 2017/0127566 A1* | 5/2017 | Imura | H05K 7/20309 |

FOREIGN PATENT DOCUMENTS

| | | |
|---|---|---|
| JP | 2007020238 A | 1/2007 |
| JP | 2009278712 A | 11/2009 |
| KR | 20150033060 A | 4/2015 |

\* cited by examiner

DEVICE FOR RADIATING HEAT OF CAPACITOR OF AN INVERTER IN AN ELECTRIC COMPRESSOR

CROSS-REFERENCE TO RELATED APPLICATIONS

This patent application is a continuation patent application of U.S. patent application Ser. No. 15/027,010 filed Apr. 4, 2016 which is a United States national phase patent application based on PCT/KR2015/002762 filed Mar. 20, 2015. The entire disclosures of the above patent applications are hereby incorporated herein by reference.

TECHNICAL FIELD

Exemplary embodiments of the present invention relate to an apparatus for cooling an inverter of an electric compressor that dissipates heat of a capacitor of an inverter, which receives power supplied from a battery and controls the rotation speed of a motor.

BACKGROUND

Vehicles include an air conditioning system for cooling or heating a passenger compartment. The air conditioning system includes, as a configuration for a cooling system, a compressor, which compresses low-temperature and low-pressure gaseous refrigerant drawn from an evaporator into a high-temperature and high-pressure gaseous state, and sends it a condenser. Such compressors are classified into a mechanical type which rotates using an engine as a drive source to perform the compression, and an electric type which uses a motor as a drive source.

As shown in FIG. 1, an electric compressor includes a compression unit 100 which performs the compression, a motor unit 200 which drives the compression unit 100, and an inverter unit 300 which receives power from a battery of a vehicle and controls the rotation speed of the motor unit 200 to adjust the rate at which refrigerant is compressed.

As shown in FIGS. 2 and 3, the inverter unit 300 includes an inverter housing 330 which is coupled to a rear end of the motor unit 200, and an inverter which is provided in such a way that various circuit elements including a switching element (IGBT; Insulated Gate Bipolar Transistor) and a capacitor 320 are mounted on a printed circuit board (PCB) 310 in the inverter housing 330.

Because the switching element and the capacitor 320 of the inverter generate a large amount of heat, heat dissipation is required. Particularly, the capacitor 320 is largest among electronic parts of the inverter and is easily affected by surrounding environment compared to the other electronic parts. Hence, the capacitor 320 is one of the most critical factors in determining the lifetime of the inverter.

That is, despite the fact that the electric compressor is installed in an engine room and is under conditions of high ambient temperatures of 100° C. or more, heat dissipation has not been satisfactorily performed, thus greatly reducing the lifetime of the capacitor 320. For example, the conventional capacitor 320 may be fixed to the inverter housing 330 by a fixing adhesive such as silicon. In this case, the heat dissipation performance greatly deteriorates due to the adhesive, whereby the lifetime of the capacitor 320 is shortened.

Furthermore, a flow rate of ripple current that flows through the capacitor 320 frequently increases over an allowable value of the capacitor 320, thus further shortening the lifetime of the capacitor 320. This leads to shortening of the lifetime of the inverter.

Previously, as the electric compressor has been used for extremely limited purposes, there has been no problem even though special measures for increasing the lifetime of the inverter of the electric compressor are not taken. However, as the range of use of the electric compressor is gradually expanded for purposes of a heat pump mode, an increase in rated voltage, etc., the factor of securing the reliability in lifetime becomes increasingly important.

SUMMARY OF THE INVENTION

Previously, as the electric compressor has been used for extremely limited purposes, there has been no problem even though special measures for increasing the lifetime of the inverter of the electric compressor are not taken. However, as the range of use of the electric compressor is gradually expanded for purposes of a heat pump mode, an increase in rated voltage, etc., the factor of securing the reliability in lifetime becomes increasingly important.

Technical Problem

An embodiment of the present invention relates to an apparatus for cooling an inverter of an electric compressor which is capable of markedly reducing the temperature of a capacitor by heat dissipation using a contact-type method, thus enhancing the durability of the capacitor, thereby increasing the lifetime of the inverter.

Another embodiment of the present invention relates to an inverter assembly including the above-mentioned cooling apparatus.

Technical Solution

In an aspect, an apparatus for cooling an inverter of a vehicle in accordance with a first embodiment of the present invention may include: an inverter housing configured to support the inverter that receives power supplied from a vehicle battery and controls a rotation speed of a motor; and a heat dissipation unit provided at a predetermined position in the inverter housing and configured to come into contact with an outer circumferential surface of the capacitor so that heat of the capacitor is transferred to the inverter housing.

In the apparatus in accordance with the first embodiment of the present invention, the heat dissipation unit may extend along a longitudinal direction of the capacitor.

In the apparatus in accordance with the first embodiment of the present invention, the heat dissipation unit may include a contact surface coming into contact with the outer circumferential surface of the capacitor and having an arc-shaped cross-section. The contact surface of the heat dissipation unit may be formed at the same curvature as the outer circumferential surface of the capacitor.

In the apparatus in accordance with the first embodiment of the present invention, the heat dissipation unit may be integrally formed with the invert housing.

In the apparatus in accordance with the first embodiment of the present invention, the heat dissipation unit may include: a heat dissipation body provided to be spaced apart from the capacitor by a predetermined distance; and a heat dissipation pad provided between the heat dissipation body and the capacitor, and having at one side thereof a contact surface to come into contact with the outer circumferential surface of the capacitor.

In the apparatus in accordance with the first embodiment of the present invention, the heat dissipation pad may be made of flexible soft material.

In the apparatus in accordance with the first embodiment of the present invention, the heat dissipation pad may have a plate shape having an arc-shaped cross-section and extending along the longitudinal direction of the capacitor, and the heat dissipation body may include a heat-dissipation-pad receiving portion on which the heat dissipation pad is seated.

In the apparatus in accordance with the first embodiment of the present invention, the inverter may include a capacitor holder provided to fix the capacitor to a portion of a printed circuit board, the capacitor holder including a pair of clamps clamping the outer circumferential surface of the capacitor. The heat dissipation pad may be provided between the pair of clamps so that both ends thereof in an arc direction are stopped by front ends of the pair of clamps and thus prevented from moving.

In another aspect, an inverter assembly in accordance with an embodiment of the present invention may include: an inverter controlling a rotation speed of a motor, and including at least one or more capacitors; and an inverter housing in which the inverter is housed, wherein the inverter housing may be provided with a heat sink coming into contact with at least one of the capacitors to perform heat transfer therewith.

The features and advantages of the present invention will be more clearly understood from the following detailed description taken in conjunction with the accompanying drawings.

Advantageous Effects

In accordance with the present invention, the temperature of a capacitor can be markedly reduced by heat dissipation using a contact-type method, whereby the lifetime thereof can be increased, and the capacitor can be prevented from being damaged by vibrations. Furthermore, a heat dissipation structure for the capacitor can be embodied in such a way that the structure of an inverter housing is simplified, thus minimizing the production cost, and increasing the lifetime of the inverter.

DETAILED DESCRIPTION OF EXEMPLARY EMBODIMENTS OF THE INVENTION

Hereinafter, an apparatus for cooling an inverter of an electric compressor in accordance with an exemplary embodiment of the present invention will be described in detail with reference to the attached drawings.

Figure 1:
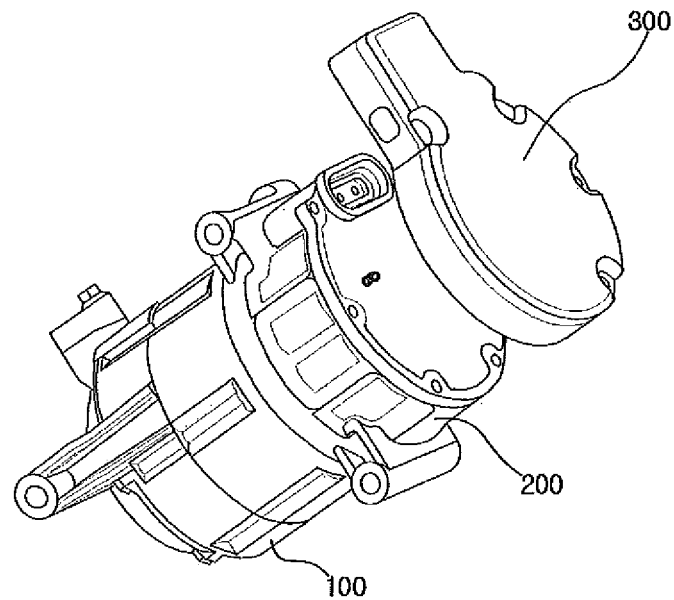
FIG. 1 is a perspective view illustrating an electric compressor.
Figure 2:
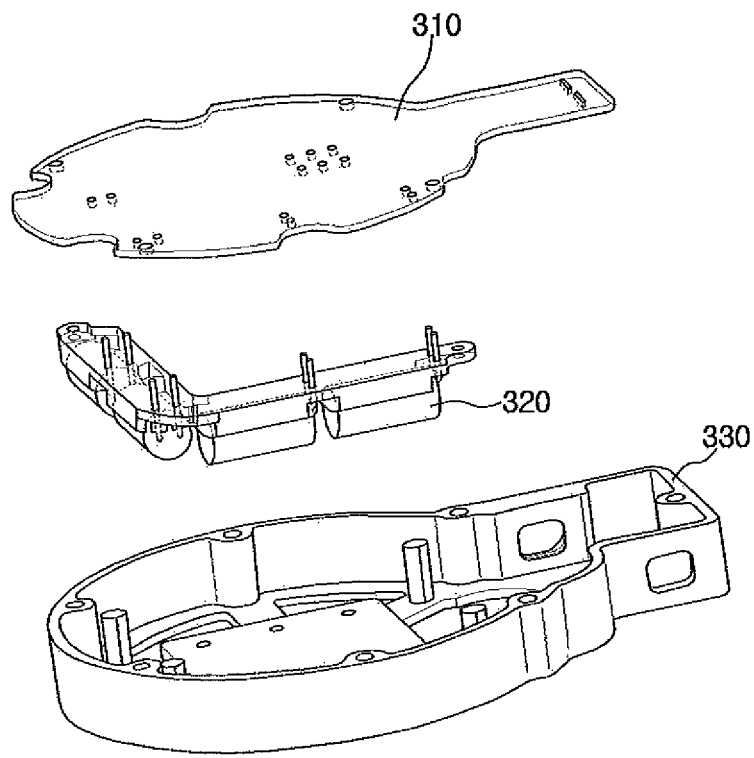
FIG. 2 is an exploded perspective view illustrating an inverter assembly of an electric compressor.
Figure 3:
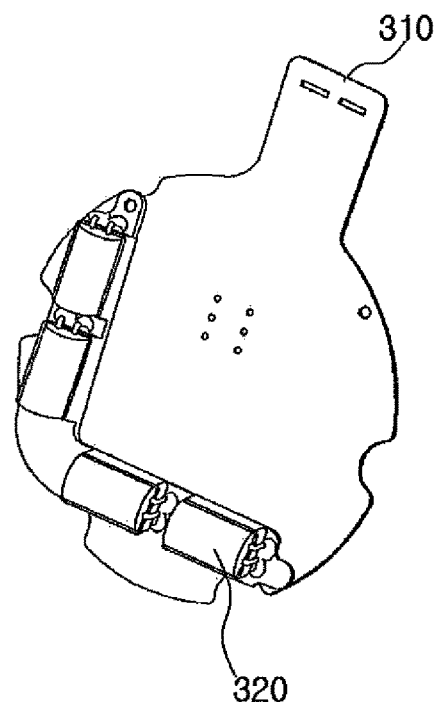
FIG. 3 is a perspective view illustrating an assembled state of a capacitor and a printed circuit board of the electric compressor of FIG. 2.
Figure 4:
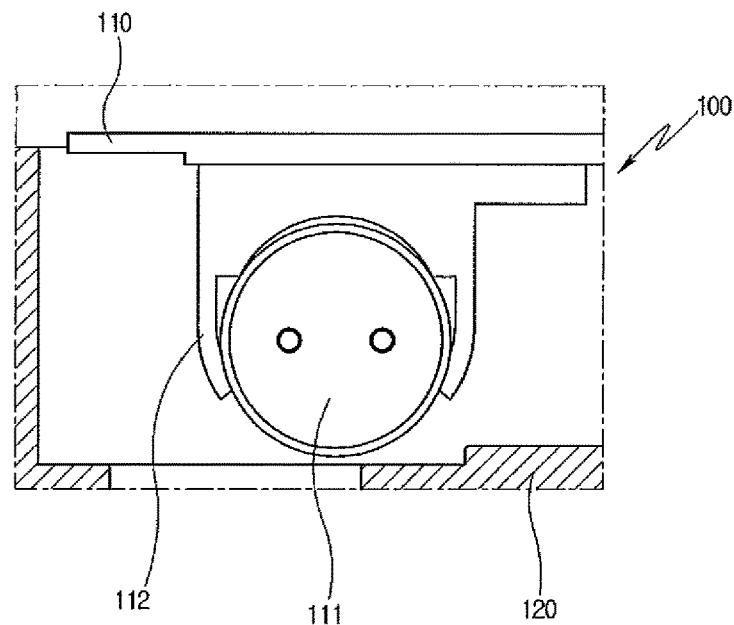
FIG. 4 is an enlarged fragmentary assembled cross-sectional view showing an inverter assembly of an electric compressor in accordance with a conventional technique.
Figure 5:
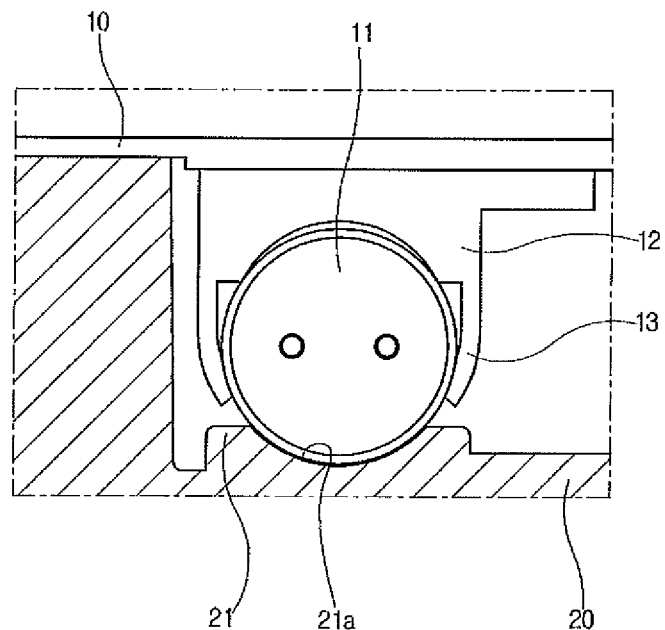
FIG. 5 is an enlarged fragmentary cross-sectional view illustrating an apparatus for cooling an inverter of an electric compressor in accordance with an embodiment of the present invention.
Figure 6:
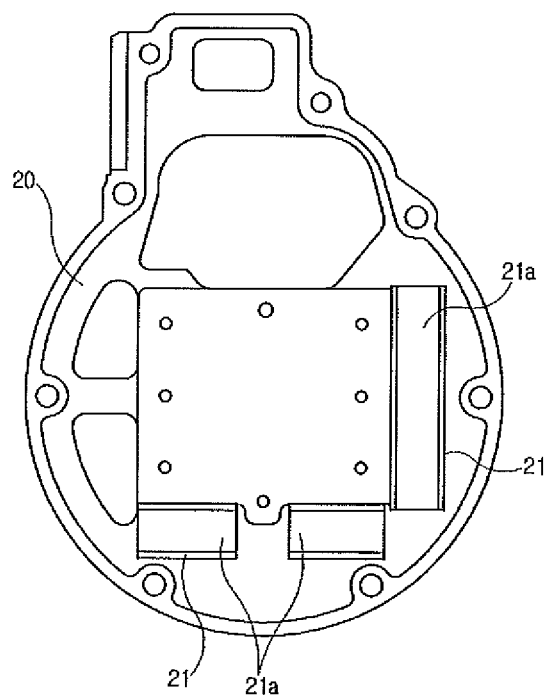
FIG. 6 is a plan view illustrating an inverter housing of the electric compressor shown in FIG. 5.
Figure 7:
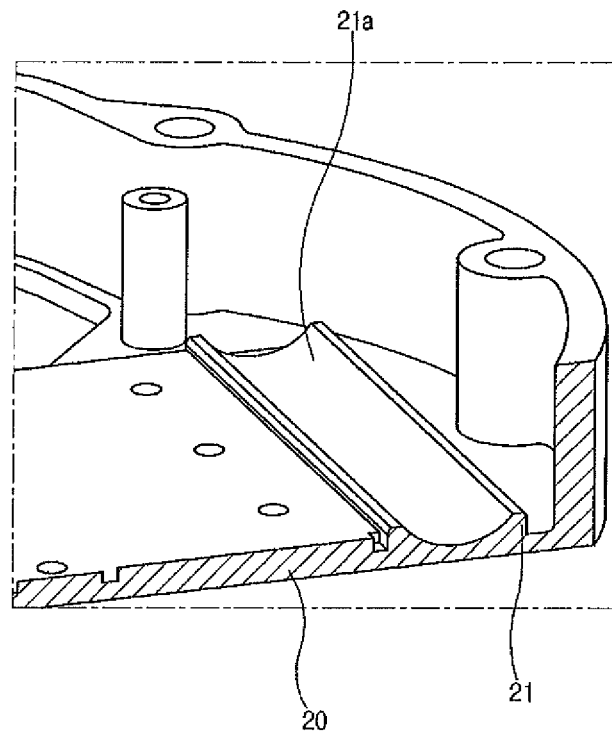
FIG. 7 is an enlarged fragmentary perspective view illustrating an inverter housing of the electric compressor shown in FIG. 5.

Referring to FIGS. 5 to 7, the apparatus for cooling the inverter in accordance with the present embodiment of the present invention includes an inverter housing 20 which supports an inverter, and a heat dissipation unit 21 which is provided in contact with an outer circumferential surface of a capacitor 11.

The inverter is provided in the inverter housing 20 in a configuration in which various kinds of circuit elements including a switching element (IGBT; Insulated Gate Bipolar Transistor) and the capacitor 11 are mounted on a printed circuit board (PCB) 10.

The PCB 10 of the inverter is fixed to a portion of the inverter housing 20 by a screw. A capacitor holder 12 is provided on a portion of the PCB 10 while protruding toward the inverter housing 20.

The capacitor holder 12 includes a pair of clamps 13, which clamp the outer circumferential surface of the cylindrical capacitor 11.

The inverter housing 20 has an approximately 'U'-shaped cross-sectional shape and receives therein electronic parts including the capacitor 11 that protrudes toward the portion of the PCB 10. The heat dissipation unit 21 is formed to protrude inward from a bottom surface of the inverter housing 20.

The heat dissipation unit 21 is formed on the bottom surface of the inverter housing 20 at a position below the capacitor 11 and has a contact surface 21a which comes into contact with the outer circumferential surface of the capacitor 11.

The contact surface 21a of the heat dissipation unit 21 has an arc-shaped cross-section with the same curvature as that of the outer circumferential surface of the cylindrical capacitor 11 and extends along a longitudinal direction of the capacitor 11. Therefore, the contact surface 21a comes into close contact with the outer circumferential surface of the capacitor 11 and thus is able to receive heat generated from the capacitor 11 and transfer it to the inverter housing 20.

In the present embodiment, the heat dissipation unit 21 is integrally formed with the inverter housing 20 so that heat generated from the capacitor 11 is directly transferred to the inverter housing 20. However, the heat dissipation unit 21 and the inverter housing 20 may be separately provided from each other and coupled to come into contact with each other to allow heat transfer therebetween.

In the case where the heat dissipation unit 21 is integrally formed with the inverter housing 20, the same material is also used to form them. Consequently, the heat dissipation unit 21 has the same thermal conductivity as that of the inverter housing 20.

Meanwhile, because various vibrations are transmitted to the electric compressor during the driving of a vehicle, the inverter is faced with the problem of a reduction in the lifetime or deterioration in the performance due to continuous vibrations. Particularly, since the capacitor 11 is largest among the circuit elements, it is most vulnerable to vibrations.

Figure 8:
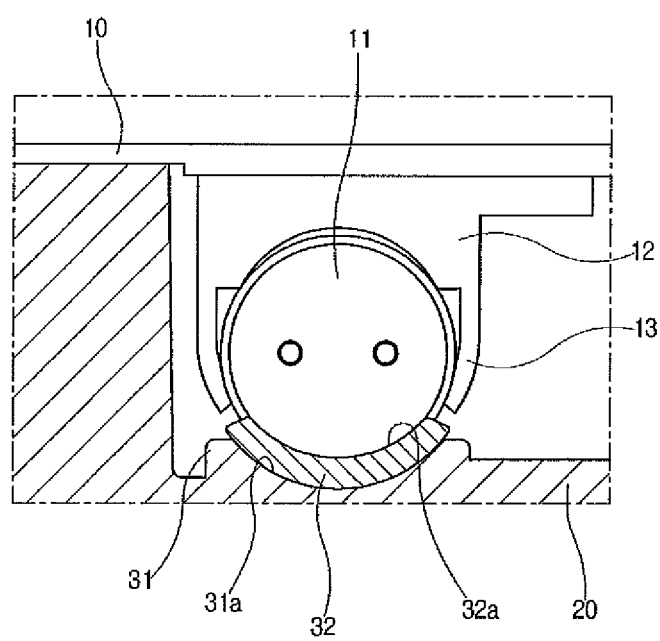
FIG. 8 is an enlarged fragmentary cross-sectional view illustrating an apparatus for cooling an inverter of an electric compressor in accordance with another embodiment of the present invention.

Another embodiment of the apparatus for cooling the inverter for an electric compressor having an additional vibration-proof function will be described with reference to FIG. 8.

The heat dissipation unit 21 in accordance with the present embodiment includes a heat dissipation body 31 which is provided to be spaced apart from the capacitor 11 by a predetermined distance, and a heat dissipation pad 32 which is provided between the heat dissipation body 31 and the capacitor 11.

The heat dissipation body 31 is integrally formed with the inverter housing 20 so that heat transferred from the heat dissipation pad 32 is directly transferred to the inverter housing 20. A heat-dissipation-pad receiving portion 31a, on which the heat dissipation pad 32 is seated, is formed on an upper surface of the heat dissipation body 31.

The heat dissipation pad 32 has on an upper surface thereof a contact surface 32a, which comes into contact with the outer circumferential surface of the capacitor 11. A lower surface of the heat dissipation pad 32 comes into contact with an inner surface of the heat-dissipation-pad receiving portion 31a of the heat dissipation body 31. That is, as the cross-section of the heat dissipation pad 32 has an arc shape corresponding to the arc-shaped contact surface 32a, the upper surface of the heat dissipation pad 32 comes into close contact with the capacitor 11 while the lower surface thereof makes close contact with the heat dissipation body 31. As the arc-shaped cross-section of the heat dissipation pad 32 extends along the longitudinal direction of the capacitor 11, the heat dissipation pad 32 overall has a curved plate shape.

The heat dissipation pad 32 is provided in a space between the heat dissipation body 31 and the capacitor 11. In a state in which the heat dissipation pad 32 is seated on the heat-dissipation-pad receiving portion 31a of the heat dissipation body 31, the upper contact surface 32a of the heat dissipation pad 32 comes into contact with the capacitor 11 while the lower surface thereof comes into contact with the heat dissipation body 31. Thus, the heat dissipation pad 32 receives heat from the capacitor 11 and transfers it to the heat dissipation body 31.

The heat dissipation pad 32 is disposed between the pair of clamps 13 of the capacitor holder 12. The pair of clamps 13 clamps the outer circumferential surface of the capacitor 11. Here, because the clamps 13 are disposed to be exposed outside the capacitor 11, both ends of the heat dissipation pad 32 are stopped by front ends of the pair of clamps 13 and thus prevented from moving. Thereby, the heat dissipation pad 32 can be prevented from being removed from space between the capacitor 11 and the heat dissipation body 31 without using a separate fixing means.

While the heat dissipation body 31 is made of the same hard thermal conductor as the material of the inverter housing 20, the heat dissipation pad 32 is made of soft flexible material different therefrom. As such, since the heat dissipation pad 32 has flexibility, it can absorb vibrations transmitted from the inverter housing 20 to the capacitor 11 or from the capacitor 11 to the inverter housing 20, thus providing the vibration-proof function of protecting the capacitor 11 from vibrations.

The heat dissipation pad 32 is made of soft material, but has high thermal conductivity. Therefore, both the vibration-proof performance and the heat dissipation performance can be satisfactory.

In the case of the conventional technique using capacitor-fixing silicon having a thermal conductivity of 0.17 W/m-K, when the motor was operated at 4000 rpm under conditions of an ambient temperature of 100° C., the surface of the capacitor 11 was approximately 114° C. However, in the case of the heat dissipation pad 32 having a thermal conductivity of 3.0 Wm-K, the surface temperature of the capacitor 11 was measured as being 85° C., which is reduced by 30° C., under the same conditions. In the case of typical capacitors, when the temperature is increased by 10° C., the lifetime is reduced to ½. Therefore, the present invention can obtain the effect of an increase in the lifetime by eight times.

Although the exemplary embodiments of the present invention have been disclosed for illustrative purposes, it will be appreciated that the present invention is not limited thereto, and those skilled in the art will appreciate that various modifications, additions, and substitutions are possible, without departing from the scope and spirit of the invention.

Accordingly, any and all modifications, variations or equivalent arrangements should be considered to be within the scope of the invention, and the detailed scope of the invention will be disclosed by the accompanying claims.

What is claimed is:

1. An electric compressor in an air conditioning system of a vehicle comprising:
   a compressor unit compressing a working fluid;
   a motor unit driving the compressor unit; and
   an inverter unit controlling the motor unit and thermally connected to the motor unit, the inverter unit further comprising:
      an inverter housing receiving the inverter, the inverter housing including a capacitor; and
      a heat dissipation unit disposed in the inverter housing and made of a same material as the inverter housing, the heat dissipation unit contacting an outer surface of the capacitor and providing heat transfer communication between the capacitor and the inverter housing.

2. The compressor of claim 1, wherein the heat dissipation unit extends along a longitudinal direction of the capacitor.

3. The compressor of claim 1, wherein the outer surface of the capacitor is cylindrical.

4. The compressor of claim 3, wherein the heat dissipation unit includes a contact surface contacting the outer surface of the capacitor, the contact surface having an arcuate cross-sectional shape.

5. The compressor of claim 4, wherein the contact surface has a curvature equal to a curvature of the outer surface of the capacitor.

6. The compressor of claim 1, wherein the heat dissipation unit is integrally formed with the inverter housing.

7. The compressor of claim 1, wherein the heat dissipation unit includes a heat dissipation body spaced from the capacitor and a heat dissipation pad disposed between the heat dissipation body and the capacitor, the heat dissipation pad having a contact surface contacting the outer surface of the capacitor.

8. The compressor of claim 7, wherein the heat dissipation pad is formed from a flexible material.

9. The compressor of claim 7, wherein the heat dissipation pad has an arcuate cross-sectional shape and extends along a longitudinal direction of the capacitor, and wherein the heat dissipation body includes a heat dissipation pad receiving portion accommodating the heat dissipation pad.

10. The compressor of claim 9, further comprising:
a capacitor holder disposed in the inverter housing; and
a printed circuit board disposed in the inverter housing, the capacitor holder having a pair of clamps clamping the outer surface of the capacitor and attaching the capacitor to the printed circuit board, and wherein the pair of clamps define a space therebetween, the heat dissipation pad disposed in the space, the pair of clamps militating against movement of the heat dissipation pad.

11. An electric compressor in an air conditioning system of a vehicle comprising:
a compressor unit compressing a working fluid;
a motor unit driving the compressor unit; and
an inverter assembly controlling the motor unit, the inverter assembly further comprising:
an inverter controlling a rotation speed of a motor, the inverter including a capacitor;
an inverter housing receiving the inverter therein and thermally connected to the motor unit; and
a heat dissipation body disposed in the inverter housing, made of a same material as that of the inverter housing and providing heat transfer communication between the capacitor and the inverter housing.

12. The compressor of claim 11, wherein the heat dissipation body includes a contact surface having a shape corresponding to at least a portion of an outer surface of the capacitor.

13. The compressor of claim 11, wherein the heat dissipation body is integrally formed with the inverter housing.

14. The compressor of claim 11, wherein a heat dissipation pad is disposed between and in contact with the heat dissipation body and the capacitor.

15. The compressor of claim 14, wherein the heat dissipation pad has an arcuate cross-sectional shape and extends along a longitudinal direction of the capacitor, and wherein the heat dissipation body includes a heat dissipation pad receiving portion accommodating the heat dissipation pad.

16. The compressor of claim 15, wherein the inverter includes a capacitor holder and a printed circuit board, the capacitor holder attaching the capacitor to the printed circuit board, the capacitor holder having a pair of clamps clamping an outer surface of the capacitor, and wherein the pair of clamps define a space therebetween, the heat dissipation pad disposed in the space, the pair of clamps militating against rotational movement of the heat dissipation pad.

* * * * *